US010957620B2

(12) United States Patent
Chung et al.

(10) Patent No.: US 10,957,620 B2
(45) Date of Patent: Mar. 23, 2021

(54) ELECTRONIC DEVICE INCLUDING COOLING STRUCTURE

(71) Applicant: SAMSUNG ELECTRONICS CO., LTD., Suwon-si (KR)

(72) Inventors: Jae Ho Chung, Suwon-si (KR); Soo Ho Noh, Suwon-si (KR); Jin Seok Yoon Park, Hwaseong-si (KR); Se Young Jang, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/811,944

(22) Filed: Mar. 6, 2020

(65) Prior Publication Data

US 2020/0211918 A1    Jul. 2, 2020

Related U.S. Application Data

(63) Continuation of application No. 16/074,848, filed as application No. PCT/KR2017/002100 on Feb. 24, 2017, now Pat. No. 10,699,985.

(30) Foreign Application Priority Data

Feb. 26, 2016 (KR) .......................... 10-2016-0023555

(51) Int. Cl.
*H01L 23/427* (2006.01)
*H01L 23/367* (2006.01)
(Continued)

(52) U.S. Cl.
CPC ............ *H01L 23/3675* (2013.01); *C09K 5/14* (2013.01); *G06F 1/20* (2013.01); *G06F 1/203* (2013.01);
(Continued)

(58) Field of Classification Search
CPC ............ H01L 23/427; H01L 2023/405; H01L 23/552
See application file for complete search history.

(56) References Cited

U.S. PATENT DOCUMENTS 6,122,169 A    9/2000  Liu
6,650,540 B2  11/2003  Ishikawa
(Continued)

FOREIGN PATENT DOCUMENTS

CN    1422111    6/2003
CN    1953646    4/2007
(Continued)

OTHER PUBLICATIONS

Second Office Action dated Jul. 6, 2020 in counterpart Chinese Patent Application Appl. No. 201780013534.X and English-language translation.

(Continued)

*Primary Examiner* — George R Fourson, III
(74) *Attorney, Agent, or Firm* — Nixon & Vanderhye, P.C.

(57) ABSTRACT

An electronic device according to various embodiments of the present disclosure includes a housing, a printed circuit board located inside the housing, an electrical element mounted on the printed circuit board, and a shield can that covers the electrical element. A recess area is formed on at least a portion of the shield can, and a metal structure is mounted in the recess area to cool heat generated by the electrical element.

15 Claims, 11 Drawing Sheets

(51) Int. Cl.
  *C09K 5/14* (2006.01)
  *G06F 1/20* (2006.01)
  *H05K 9/00* (2006.01)
  *H05K 7/20* (2006.01)
  *H05K 1/02* (2006.01)
  *H01L 23/373* (2006.01)
(52) U.S. Cl.
  CPC ....... *H01L 23/3736* (2013.01); *H05K 1/0203* (2013.01); *H05K 7/20* (2013.01); *H05K 7/20209* (2013.01); *H05K 9/00* (2013.01); *H05K 1/0216* (2013.01); *H05K 2201/10371* (2013.01)

(56) References Cited

U.S. PATENT DOCUMENTS

| | | | |
|---|---|---|---|
| 6,982,481 | B1 | 1/2006 | Sonderegger |
| 7,903,409 | B2 | 3/2011 | Patel et al. |
| 8,392,035 | B2 | 3/2013 | Patel et al. |
| 8,552,302 | B2 | 10/2013 | Park et al. |
| 8,929,078 | B2 | 1/2015 | Weeber et al. |
| 2002/0075650 | A1 | 6/2002 | Morris |
| 2003/0053294 | A1 | 3/2003 | Yamada et al. |
| 2003/0067757 | A1 | 4/2003 | Richardson |
| 2003/0099091 | A1 | 5/2003 | Ishikawa |
| 2004/0135239 | A1 | 7/2004 | Radu |
| 2004/0196634 | A1 | 10/2004 | Mallik |
| 2006/0203453 | A1 | 9/2006 | Chen |
| 2007/0017701 | A1 | 1/2007 | Liang |
| 2007/0035929 | A1 | 2/2007 | Hsu |
| 2007/0086170 | A1* | 4/2007 | Liang .................. H05K 7/2039 361/719 |
| 2009/0021908 | A1 | 1/2009 | Patel et al. |
| 2011/0127024 | A1 | 6/2011 | Patel et al. |
| 2011/0155426 | A1 | 6/2011 | Park et al. |
| 2011/0176279 | A1 | 7/2011 | Zhao |
| 2011/0255250 | A1 | 10/2011 | Dinh |
| 2012/0300405 | A1 | 11/2012 | Weeber et al. |
| 2013/0233611 | A1 | 9/2013 | Malek |
| 2014/0108694 | A1 | 4/2014 | Chung et al. |
| 2015/0029658 | A1 | 1/2015 | Yairi |
| 2015/0282387 | A1* | 10/2015 | Yoo .................. H05K 1/0203 361/700 |
| 2016/0116528 | A1 | 4/2016 | Narasaki |
| 2016/0282914 | A1 | 9/2016 | Saito et al. |
| 2016/0301442 | A1 | 10/2016 | Sohn |
| 2017/0070262 | A1 | 3/2017 | Collins |
| 2017/0098592 | A1 | 4/2017 | Jin et al. |
| 2017/0105278 | A1 | 4/2017 | Cooper |
| 2017/0163302 | A1 | 6/2017 | Saeidi |
| 2017/0220074 | A1 | 8/2017 | Cooper |
| 2018/0007181 | A1 | 1/2018 | Lee |
| 2018/0288908 | A1 | 10/2018 | Lee |
| 2019/0131206 | A1 | 5/2019 | Talpallikar |

FOREIGN PATENT DOCUMENTS

| | | |
|---|---|---|
| CN | 101668410 | 3/2010 |
| CN | 102413662 | 4/2012 |
| CN | 102656961 | 9/2012 |
| CN | 104813760 | 7/2015 |
| JP | 2014-236139 | 12/2014 |
| JP | 2015-095629 | 5/2015 |
| KR | 10-2016-0009914 | 1/2016 |
| WO | 2009-011879 | 1/2009 |

OTHER PUBLICATIONS

International Search Report for PCT/KR2017/002100 dated Apr. 28, 2017, four (4) pages.

Written Opinion of the Isa for PCT/KR2017/002100 dated Apr. 28, 2017, five (5) pages.

Notice of Result of Preliminary Examination dated Dec. 4, 2018 in counterpart Korean Patent Application No. 10-2016-0023555 and English-language translation.

Extended Search Report dated Jan. 25, 2019 in counterpart European Patent Application No. 17756876.3.

First Office Action dated Nov. 5, 2019 in counterpart Chinese Patent Application No. 201780013534.X and English-language translation.

* cited by examiner

ELECTRONIC DEVICE INCLUDING COOLING STRUCTURE

CROSS-REFERENCE TO RELATED APPLICATIONS

This application is a continuation of U.S. application Ser. No. 16/074,848, filed on Aug. 2, 2018, which is a national stage application of International Patent Application No. PCT/KR2017/002100, filed on Feb. 24, 2017, which designates the United States, and which claims priority to Korean Patent Application No. 10-2016-0023555, filed Feb. 26, 2016. The contents of each of these applications are incorporated herein in their entirety.

TECHNICAL FIELD

Various embodiments of the present disclosure relate to an electronic device that includes a cooling structure for cooling heat generated by an electrical element.

BACKGROUND AND SUMMARY

An electronic device, such as a smartphone, a tablet PC, or the like, may perform various functions, for example, wireless data communication, media output, or the like. Electrical elements (e.g., a CPU, a GPU, a communication IC, a display driver IC, and the like) required for performing various functions may be included in the electronic device. The electrical elements may be mounted on a printed circuit board to operate. The electrical elements may generate heat while operating. As data processing speed of the electrical elements increases, required power also increases and a large amount of heat may be generated correspondingly.

The electrical elements, surrounding parts, and the electronic device may break down if the heat generated by the electrical elements is not effectively dispersed or cooled. A processor (e.g., a CPU or an AP) included in the electronic device may generate a larger amount of heat than other parts, and the temperature of the processor may instantaneously rise. A failure to effectively disperse the heat generated by the processor may cause a breakdown in the processor itself or integrated chips (ICs) around the processor.

An electronic device in the related art may diffuse heat throughout the electronic device, or may cool the heat, by using a cooling module, such as a fan, a heat sink, or the like, which is disposed around an electrical element such as a CPU, a GPU, or the like. In this case, the cooling module disposed around the CPU, the GPU, or the like is large in size and designed with a heavy metal material and has a structure (e.g., a spring screw) located next to the CPU, the GPU, or the like so as not to be separated due to drop or impact.

Among cooling modules, a fan has problems in that the fan is thick due to a motor inside and it is difficult to mount the fan in a slim electronic device that lacks a mounting space.

In accordance with an aspect of the present disclosure, an electronic device according to various embodiments of the present disclosure includes a housing, a printed circuit board located inside the housing, an electrical element mounted on the printed circuit board, and a shield can that covers the electrical element. A recess area is formed on at least a portion of the shield can, and a metal structure is mounted in the recess area to cool heat generated by the electrical element.

An electronic device according to various embodiments of the present disclosure may have a thin cooling module mounted therein, which is obtained by bonding different types of metal plates, and thus slimness of the electronic device may be realized.

The electronic device according to various embodiments of the present disclosure may have a water-cooled tube or a metal plate mounted in a shield can to effectively cool heat radiating from various electrical elements, such as a CPU, a GPU, a memory, and the like.

The electronic device according to various embodiments of the present disclosure may disperse the heat radiating from the electrical elements into surroundings through a thermal sheet or an air layer and may reduce inconvenience that a user feels due to a rise in surface temperature of the electronic device.

DETAILED DESCRIPTION OF EXAMPLE EMBODIMENTS

Figure 1:
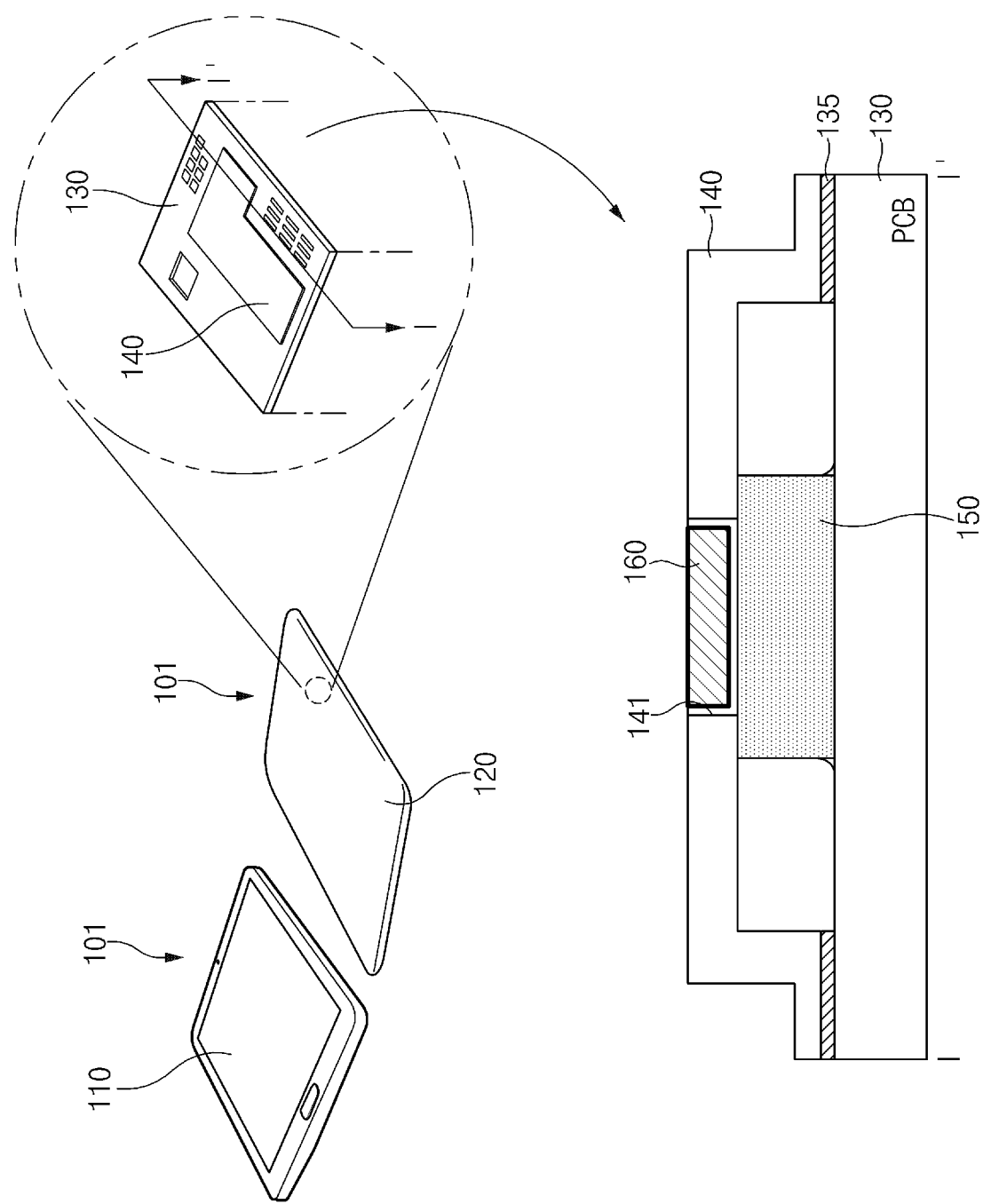
FIG. 1 illustrates an electronic device according to various embodiments.

Hereinafter, various embodiments of the present disclosure will be described with reference to the accompanying drawings. Accordingly, those of ordinary skill in the art will recognize that modification, equivalent, and/or alternative on the various embodiments described herein can be variously made without departing from the scope and spirit of the present disclosure. With regard to description of drawings, similar components may be marked by similar reference numerals.

In the disclosure disclosed herein, the expressions "have", "may have", "include" and "comprise", or "may include" and "may comprise" used herein indicate existence of corresponding features (for example, elements such as numeric values, functions, operations, or components) but do not exclude presence of additional features.

In the disclosure disclosed herein, the expressions "A or B", "at least one of A or/and B", or "one or more of A or/and B", and the like used herein may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used herein may refer to various elements of various embodiments of the present disclosure, but do not limit the elements. For example, such terms are used only to distinguish an element from another element and do not limit the order and/or priority of the elements. For example, a first user device and a second user device may represent different user devices irrespective of sequence or importance. For example, without departing the scope of the present disclosure, a first element may be referred to as a second element, and similarly, a second element may be referred to as a first element.

It will be understood that when an element (for example, a first element) is referred to as being "(operatively or communicatively) coupled with/to" or "connected to" another element (for example, a second element), it can be directly coupled with/to or connected to the other element or an intervening element (for example, a third element) may be present. In contrast, when an element (for example, a first element) is referred to as being "directly coupled with/to" or "directly connected to" another element (for example, a second element), it should be understood that there are no intervening element (for example, a third element).

According to the situation, the expression "configured to" used herein may be used as, for example, the expression "suitable for", "having the capacity to", "designed to", "adapted to", "made to", or "capable of". The term "configured to (or set to)" must not mean only "specifically designed to" in hardware. Instead, the expression "a device configured to" may mean that the device is "capable of" operating together with another device or other components. CPU, for example, a "processor configured to (or set to) perform A, B, and C" may mean a dedicated processor (for example, an embedded processor) for performing a corresponding operation or a generic-purpose processor (for example, a central processing unit (CPU) or an application processor) which may perform corresponding operations by executing one or more software programs which are stored in a memory device.

Terms used in this specification are used to describe specified embodiments of the present disclosure and are not intended to limit the scope of the present disclosure. The terms of a singular form may include plural forms unless otherwise specified. Unless otherwise defined herein, all the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal detect unless expressly so defined herein in various embodiments of the present disclosure. In some cases, even if terms are terms which are defined in the specification, they may not be interpreted to exclude embodiments of the present disclosure.

An electronic device according to various embodiments of the present disclosure may include at least one of smartphones, tablet personal computers (PCs), mobile phones, video telephones, electronic book readers, desktop PCs, laptop PCs, netbook computers, workstations, servers, personal digital assistants (PDAs), portable multimedia players (PMPs), MP3 players, mobile medical devices, cameras, and wearable devices. According to various embodiments of the present disclosure, the wearable devices may include accessories (for example, watches, rings, bracelets, ankle bracelets, glasses, contact lenses, or head-mounted devices (HMDs)), cloth-integrated types (for example, electronic clothes), body-attached types (for example, skin pads or tattoos), or implantable types (for example, implantable circuits).

In some embodiments of the present disclosure, the electronic device may be one of home appliances. The home appliances may include, for example, at least one of a digital video disk (DVD) player, an audio, a refrigerator, an air conditioner, a cleaner, an oven, a microwave oven, a washing machine, an air cleaner, a set-top box, a home automation control panel, a security control panel, a TV box (for example, Samsung HomeSync™, Apple TV™, or Google TV™), a game console (for example, Xbox™ or PlayStation™), an electronic dictionary, an electronic key, a camcorder, or an electronic panel.

In another embodiment of the present disclosure, the electronic device may include at least one of various medical devices (for example, various portable medical measurement devices (a blood glucose meter, a heart rate measuring device, a blood pressure measuring device, and a body temperature measuring device), a magnetic resonance angiography (MRA), a magnetic resonance imaging (MRI) device, a computed tomography (CT) device, a photographing device, and an ultrasonic device), a navigation system, a global navigation satellite system (GNSS), an event data recorder (EDR), a flight data recorder (FDR), a vehicular infotainment device, electronic devices for vessels (for example, a navigation device for vessels and a gyro compass), avionics, a security device, a vehicular head unit, an industrial or home robot, an automatic teller's machine (ATM) of a financial company, a point of sales (POS) of a store, or an internet of things (for example, a bulb, various sensors, an electricity or gas meter, a spring cooler device, a fire alarm device, a thermostat, an electric pole, a toaster, a sporting apparatus, a hot water tank, a heater, and a boiler).

According to some embodiments of the present disclosure, the electronic device may include at least one of a furniture or a part of a building/structure, an electronic board, an electronic signature receiving device, a projector, or various measurement devices (for example, a water service, electricity, gas, or electric wave measuring device). In various embodiments of the present disclosure, the electronic device may be one or a combination of the aforementioned devices. The electronic device according to some embodiments of the present disclosure may be a flexible electronic device. Further, the electronic device according to an embodiment of the present disclosure is not limited to the aforementioned devices, but may include new electronic devices produced due to the development of technologies.

Hereinafter, electronic devices according to an embodiment of the present disclosure will be described with reference to the accompanying drawings. The term "user" used herein may refer to a person who uses an electronic device or may refer to a device (for example, an artificial electronic device) that uses an electronic device.

FIG. 1 illustrates an electronic device according to various embodiments.

Referring to FIG. 1, an electronic device 101 may include a display module 110 and a housing 120.

The display module 110 may display various types of information (e.g., multimedia, text, an image, or the like)

provided to a user. In various embodiments, the display module 110 may include a touch panel capable of detecting a touch operation of the user, and the touch panel may recognize a contact touch operation or a proximity touch (e.g., hovering) operation of the user.

The display module 110 may be mounted on and fixed to the housing 120. The housing 120 may include various components (e.g., a processor, a DDI, a touch IC, a battery, and the like) for driving the display module 110. In addition, the housing 120 may include various components, such as a communication module, a speaker module, and the like. The exterior of the housing 120 may be formed of a nonmetallic material (e.g., plastic), a metallic material, or the like.

A printed circuit board 130 for mounting various electrical elements (e.g., an AP, a CPU, a GPU, a memory, a communication IC, and the like) may be mounted in the housing 120. The printed circuit board 130 may electrically connect the electrical elements (e.g., an AP, a CPU, a GPU, a memory, a communication IC, and the like) mounted thereon and may allow the electrical elements to be driven by electrical signals.

Referring to a sectional view taken in the direction of line I-I' of FIG. 1, an electrical element 150 (e.g., an AP, a CPU, a GPU, a memory, a communication IC, or the like) mounted on the printed circuit board 130 may be covered with a shield can 140. The shield can 140 may cover and protect the electrical element 150 (e.g., a CPU chip or an AP chip) mounted on the printed circuit board 130. In various embodiments, the shield can 140 may be formed of a metallic material (e.g., aluminum) with a specified stiffness or higher.

In various embodiments, a gasket 135 may be disposed between a distal end of the shield can 140 and the printed circuit board 130. The gasket 135 may isolate the interior of the shield can 140 from the outside.

According to various embodiments, a configuration around the shield can 140 may form a cooling structure (or a cooling module) that diffuses heat generated when the electrical element 150 is driven, and lowers the temperature of the electrical element 150. For example, in the case where the electrical element 150 is a CPU or an application processor, the electrical element 150 may generate a large amount of heat for a relatively short period of time when executing an application with high computational complexity (e.g., a high-performance game, an application for taking or reproducing 4K video, or the like). The cooling structure including the shield can 140 may lower the temperature of the electrical element 150 by effectively diffusing or cooling the heat generated by the electrical element 150.

According to various embodiments, the shield can 140 may include a recess area 141 on at least a portion of an upper surface thereof (e.g., a surface facing the housing on a rear side of the electronic device 101). The recess area 141 may have the form of a groove that is formed toward the interior of the shield can 140 from the outside or the form of a hole that is formed through the shield can 140. In the case where the recess area 141 has a groove form, the recess area 141 may correspond to a relatively thin area of the upper surface of the shield can 140. While FIG. 1 illustrates that the recess area 141 is implemented in a groove form, the present disclosure is not limited thereto.

In various embodiments, the recess area 141 may be filled with a metal structure 160 formed of a material different from that of the shield can 140. For example, the metal structure 160 may be a metal water-cooling apparatus (e.g., a heat spreader, a vapor chamber, or the like) that has a higher thermal conductivity than the shield can 140. The metal structure 160 may contain fluid or a phase change material (e.g., water, acetone, methanol, ethanol, or the like). The metal structure 160 may absorb the heat generated by the electrical element 150 and may lower the ambient temperature by using heat of vaporization. The metal structure 160 may be implemented in various forms depending on the form of the shield can 140, the arrangement of the electrical element 150, or the like.

Hereinafter, methods for effectively diffusing and cooling the heat of the electrical element 150 by using various forms of shield cans 140 and metal structures 160 will be described.

Figure 2:
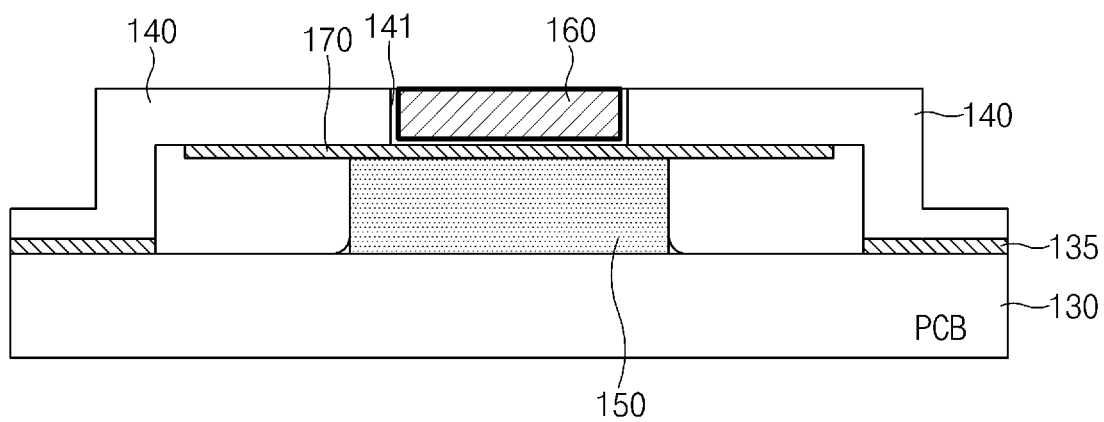
FIG. 2 is a sectional view of a shield can that includes a metal plate according to various embodiments.

FIG. 2 is a sectional view of a shield can that includes a metal plate according to various embodiments. FIG. 2 may be a sectional view taken in the direction of line I-I' in FIG. 1.

Referring to FIG. 2, the shield can 140 may further include a metal plate 170 disposed between the metal structure 160 and the electrical element 150. The metal plate 170 may primarily receive the heat generated by the electrical element 150 and may diffuse the heat into the surrounding area. In addition, the metal plate 170 may transfer the heat to the metal structure 160 with high cooling performance. In an embodiment, the metal structure 160 may be directly attached (e.g., soldered) to the metal plate 170 in the case where the recess area 141 of the shield can 140 has the form of a hole. In another embodiment, the metal plate 170 may be attached to an inner surface of the shield can 140 in the case where the recess area 141 of the shield can 140 has the form of a groove.

In various embodiments, the metal plate 170 may be implemented with a material different from that of the shield can 140. For example, the shield can 140 may be formed of aluminum, and the metal plate 170 may be formed of a copper alloy that has a higher thermal conductivity than aluminum.

In various embodiments, a lower surface of the metal plate 170 (a surface facing the electrical element 150) may be attached to a surface of the electrical element 150. For example, the metal plate 170 may be attached to an upper surface of the electrical element 150 (a surface facing the metal plate 170) by using a heat conduction adhesive, such as thermal grease. The metal plate 170 may primarily receive the heat generated by the electrical element 150. The heat transferred to the metal plate 170 may be diffused into the metal structure 160 and may be cooled.

In various embodiments, the metal plate 170 may be formed of the same material as that of the metal structure 160 or a material containing some different compositions from those of the metal structure 160. For example, the metal structure 160 may be formed of copper with high thermal conductivity, and the metal plate 170 may be formed of a copper alloy.

While FIG. 2 illustrates that the metal plate 170 is implemented with one plate, the present disclosure is not limited thereto. The metal plate 170 may be implemented in various forms depending on the internal form of the shield can 140, the form or height of the electrical element 150, or the like. For example, the metal plate 170 may be implemented with a plurality of plates and may be formed such that the height thereof in one section is different from that in another section.

Figure 3:
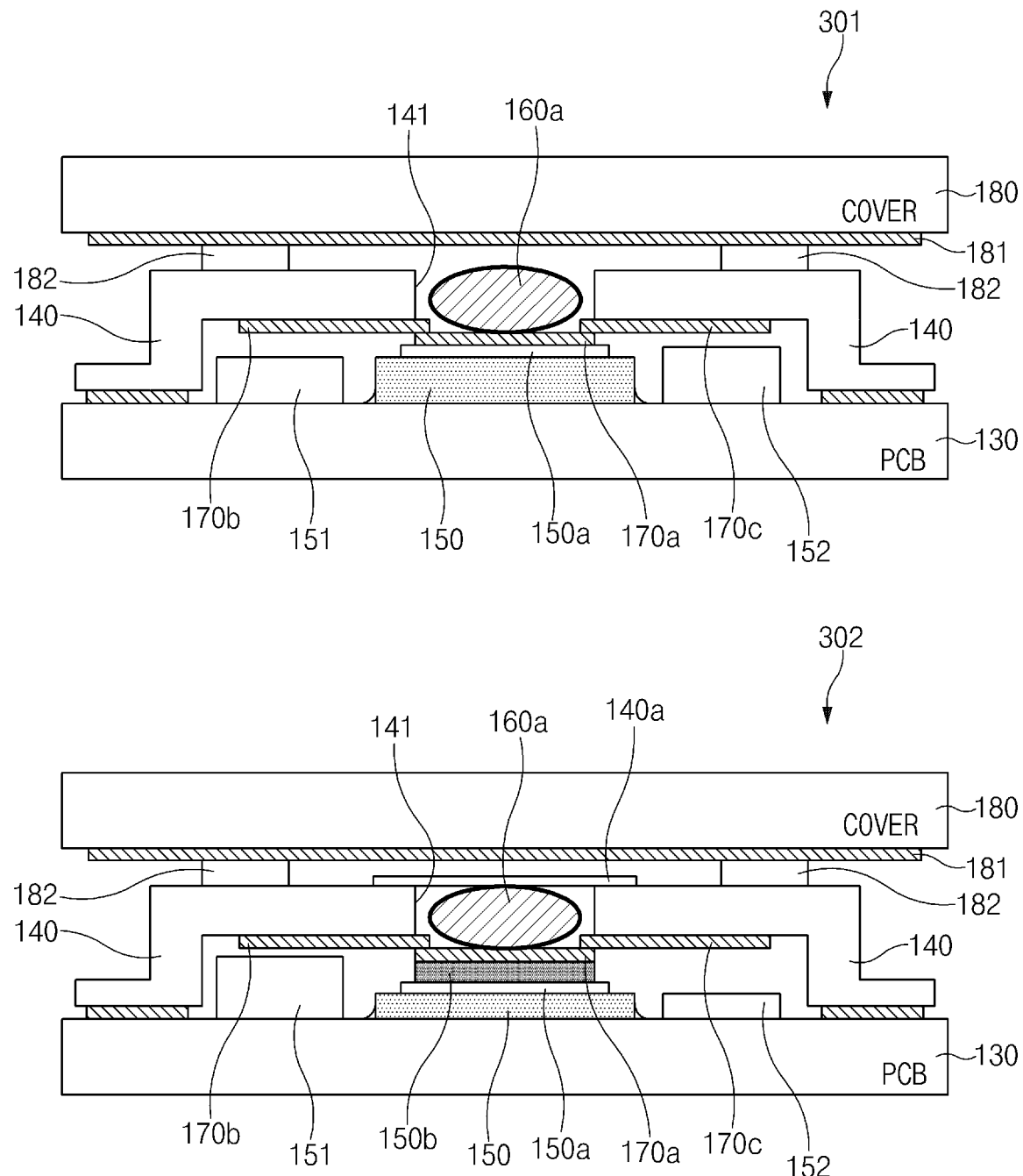
FIG. 3 illustrates components outside or inside a shield can according to various embodiments.

FIG. 3 illustrates components outside or inside a shield can according to various embodiments. FIG. 3 is merely illustrative, and the present disclosure is not limited thereto.

Referring to FIG. 3, the recess area 141 of the shield can 140 may have the form of a hole, and a water-cooled tube 160a may be disposed in the recess area 141 (see a sectional view 301 or 302). The water-cooled tube 160a may include a tube-shaped pipe therein and may have fluid or a phase change material (e.g., water, acetone, methanol, ethanol, or the like) in the pipe to cool heat transferred from the electrical element 150.

A cover 180 may be disposed outside the shield can 140. The cover 180 may be at least a portion of the housing 120 illustrated in FIG. 1, or may be a case formed separately from the housing 120. The cover 180 may protect internal components.

According to various embodiments, the cover 180 may include a cover heat sheet 181 attached to an inner surface thereof (a surface facing the shield can 140). A user may use the electronic device 101 while a part of the user's body is brought into contact with the cover 180 as needed. In this case, the cover heat sheet 181 may disperse the heat generated by the electrical element 150 to reduce heat transferred to the user through the cover 180. In various embodiments, the cover heat sheet 181 may be formed of graphite.

According to various embodiments, one or more supports 182 may be disposed between the upper surface of the shield can 140 and at least a portion of an inner surface of the cover 180 (or the cover heat sheet 181). The supports 182 may allow the shield can 140 and the cover 180 to be spaced apart from each other by a specified gap. The supports 182 may form an air layer between the shield can 140 and the cover 180, and the air layer may additionally disperse the heat directed toward the cover 180.

According to various embodiments, a thermal sheet 140a may be attached to the upper surface of the shield can 140 (or an upper surface of the water-cooled tube 160a) (see the sectional view 302). The thermal sheet 140a may disperse heat transferred to the water-cooled tube 160a to reduce heat transferred to the cover 180. In various embodiments, the supports 182 and the thermal sheet 140a may be disposed between the shield can 140 and the cover 180. In this case, heat around the water-cooled tube 160a may be primarily dispersed through the thermal sheet 140a and may be secondarily dispersed through the air layer between the shield can 140 and the cover 180.

The metal plate 170 may be disposed on the inner surface of the shield can 140. The metal plate 170 may be attached to an upper end of the electrical element 150 to diffuse the heat generated by the electrical element 150 into the surrounding area or transfer the heat to the water-cooled tube 160a. In various embodiments, the metal plate 170 inside the shield can 140 may include a plurality of plates 170a to 170c at different heights.

For example, the first plate 170a may be brought into close contact with the upper surface of the electrical element 150. The first plate 170a may have an area corresponding to the region where the water-cooled tube 160a is disposed. The second plate 170b may be disposed to surround the first plate 170a. A distal end of the second plate 170b may be connected to the first plate 170a to receive the heat generated by the electrical element 150. An upper surface of the second plate 170b may be brought into close contact with the inner surface of the shield can 140. In various embodiments, the second plate 170b may be divided into a plurality of plates.

Not only the electrical element 150 generating heat but also hardware modules or parts 151 and 152 around the electrical element 150 may be arranged inside the shield can 140. The height of a space in the shield can 140 may be determined in consideration of the height of the electrical element 150 or the heights of the hardware modules or parts 151 and 152. For example, the space in the shield can 140 may be formed to be higher than the hardware modules or parts 151 and 152 in the case where the hardware modules or parts 151 and 152 higher than the electrical element 150 are disposed around the electrical element 150, which is the main cause of heat. In this case, a metal block 150b may be disposed on the upper surface of the electrical element 150 to allow the heat generated by the electrical element 150 to be effectively transferred to the first plate 170a (see the sectional view 302). In various embodiments, the metal block 150b may be formed of the same material as, or a material similar to, that of the water-cooled tube 160a or the metal plate 170. For example, the metal block 150b may be formed of copper or a copper alloy.

According to various embodiments, the metal block 150b may be attached to the electrical element 150 through a thermal interface material (TIM) 150a.

Figure 4:
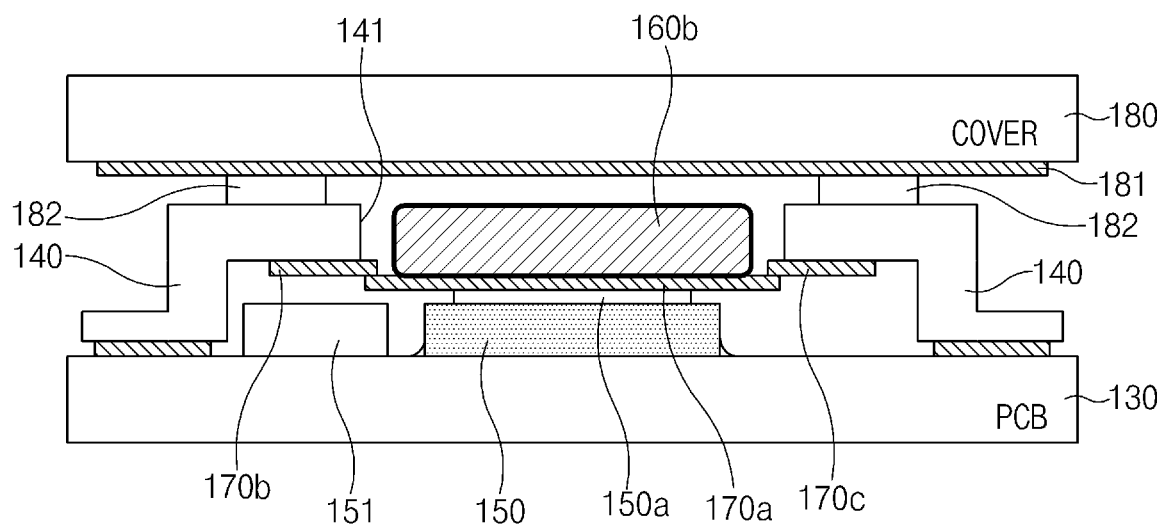
FIG. 4 illustrates a shield can that includes a chamber type cooling structure according to various embodiments.

FIG. 4 illustrates a shield can that includes a chamber type cooling structure according to various embodiments.

Referring to FIG. 4, the recess area 141 of the shield can 140 may have the form of a hole, and a water-cooled chamber 160b may be disposed in the recess area 141. The water-cooled chamber 160b may have a larger area and contain a larger amount of fluid or a phase change material (e.g., water, acetone, methanol, ethanol, or the like) than the water-cooled tube 160a in FIG. 3. The water-cooled chamber 160b may have higher heat cooling performance than the water-cooled tube 160a in FIG. 3.

The water-cooled chamber 160b may be used 1) when the electrical element 150 generating heat has a relatively large area, 2) when the shield can 140 has a relatively large inner space, or 3) when high cooling performance is required due to a large amount of heat generated by the electrical element 150.

Figure 5:
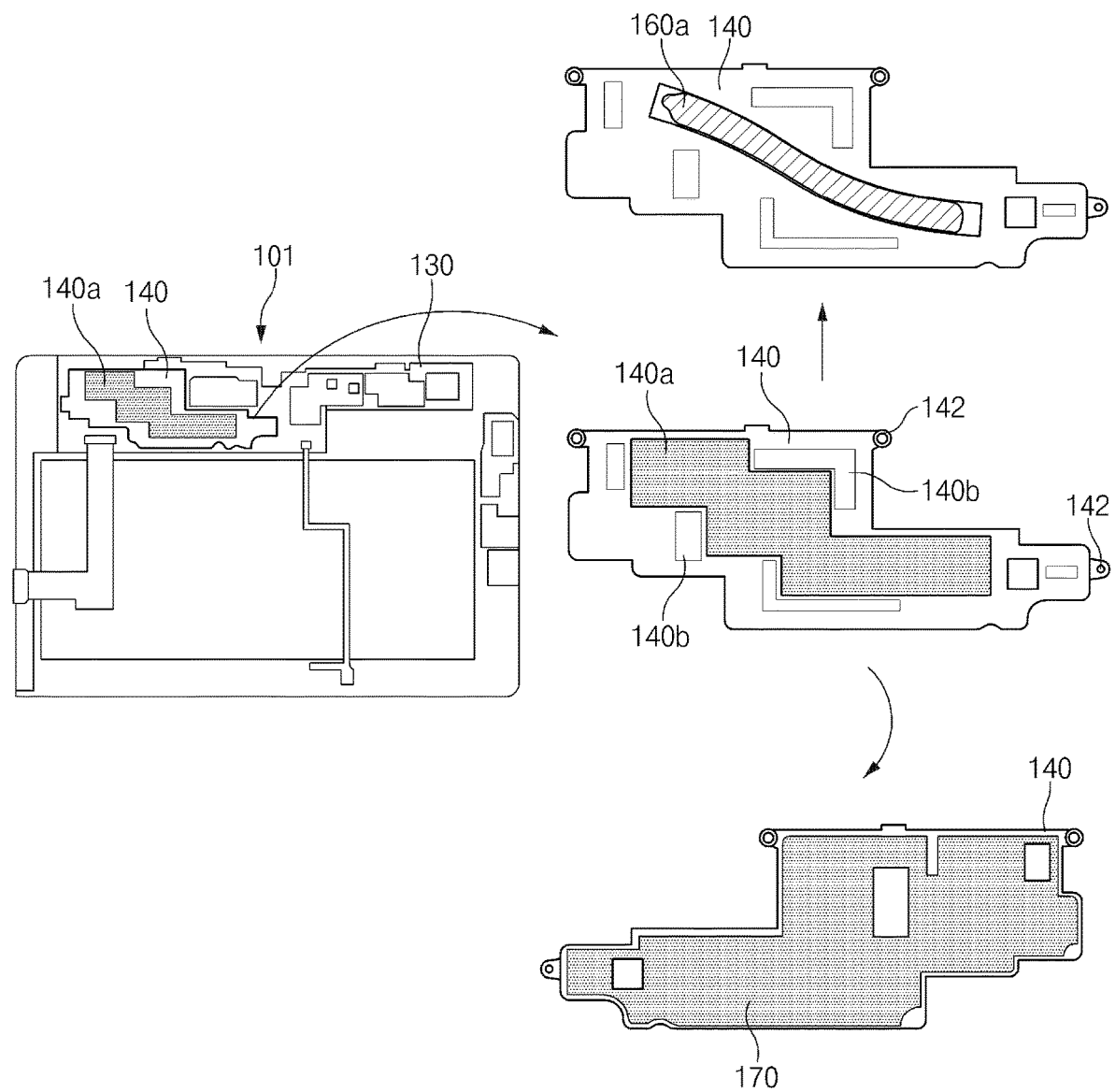
FIG. 5 illustrates a form of a shield can considering an arrangement or form of a peripheral part according to various embodiments.

FIG. 5 illustrates a form of a shield can considering an arrangement or form of a peripheral part according to various embodiments. FIG. 5 is merely illustrative, and the present disclosure is not limited thereto.

Referring to FIG. 5, the printed circuit board 130 may be disposed inside the electronic device 101. Various components, such as a battery, a socket, and the like, which are required for driving the electronic device 101 may be arranged around the printed circuit board 130. The printed circuit board 130 may include at least a partial area covered with the shield can 140.

The shield can 140 may protect electrical elements (e.g., a CPU, a GPU, a memory, and the like) mounted on the printed circuit board 130 and may cool heat generated by the electrical elements. The shield can 140 may have various forms depending on an arrangement of peripheral parts or the number or positions of electrical elements or integrated chips included therein.

In various embodiments, the shield can 140 may include at least one hole 142 at a distal end thereof. The shield can 140 may be fixed to the printed circuit board 130 through the hole 142.

In various embodiments, the thermal sheet 140a may be attached to at least a portion of the upper surface of the shield can 140. The thermal sheet 140a may cover the water-cooled tube 160a exposed through the upper surface of the shield can 140 (e.g., a surface facing a back cover of the electronic device 101). The thermal sheet 140a may disperse heat transferred to the water-cooled tube 160a into the surrounding area of the shield can 140.

In various embodiments, the shield can 140 may include a protrusion 140b on at least a portion of the upper surface thereof (e.g., a surface facing the back cover of the electronic device 101) and the protrusion 140b may protrude toward the outside. The protrusion 140b may be disposed in the remaining area other than the area where the water-cooled tube 160a is disposed. The protrusion 140b may increase the space in the shield can 140 to thicken an air layer in the shield can 140. This may allow an improvement in an effect of dispersing the heat generated by the electrical elements.

In various embodiments, the metal plate 170 may be disposed on at least a portion of a lower surface (or inner surface) of the shield can 140. The metal plate 170 may have a shape corresponding to that of the lower surface of the shield can 140. The metal plate 170 may have a smaller area than the shield can 140.

According to various embodiments, the metal plate 170 may be formed of a material that has a higher thermal conductivity than that of the shield can 140. The metal plate 170 may primarily receive the heat generated by the electrical element 150 disposed inside the shield can 140. The metal plate 170 may diffuse the transferred heat into the surrounding area, or may transfer the heat to the water-cooled tube 160a.

The water-cooled tube 160a may contain fluid or a phase change material (e.g., water, acetone, methanol, ethanol, or the like). The water-cooled tube 160a may absorb the heat generated by the electrical element 150 and may lower the ambient temperature by using heat of vaporization. In various embodiments, the water-cooled tube 160a may be arranged parallel to the upper surface of the shield can 140 and may have a curved section on at least a portion thereof.

Figure 6:
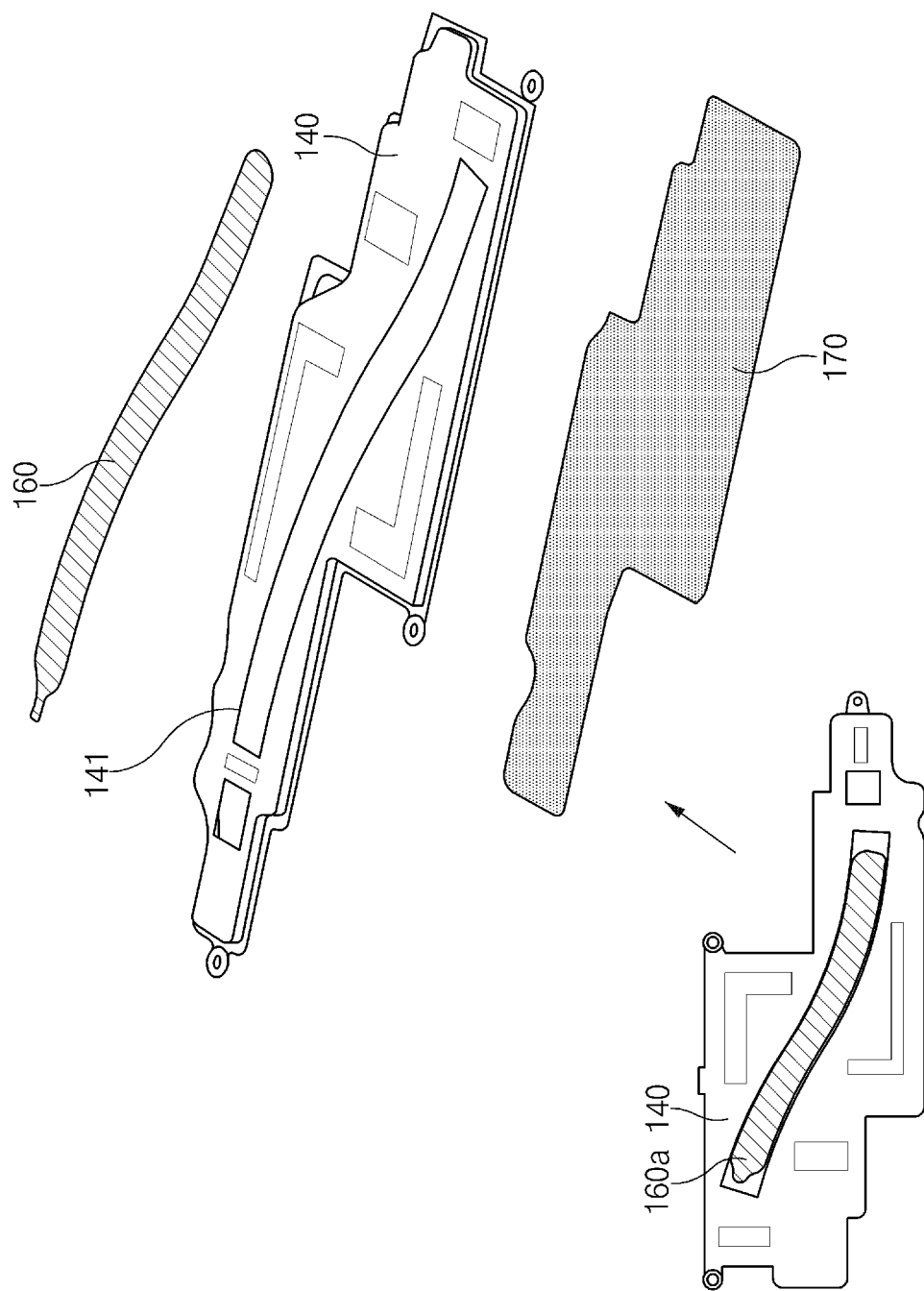
FIG. 6 is a schematic view for explaining a stack structure of a shield can according to various embodiments.

FIG. 6 is a schematic view for explaining a stack structure of a shield can according to various embodiments.

Referring to FIG. 6, the shield can 140 may be implemented in a form in which a plurality of metal layers are sequentially stacked one above another. The plurality of metal layers may diffuse or cool heat generated by an electrical element inside the shield can 140.

The shield can 140 may include, on at least a portion thereof, the recess area 141 having the form of a groove or hole. The water-cooled tube 160a for cooling heat may be mounted in the recess area 141. The water-cooled tube 160a may be fixed to the shield can 140 in the case where the recess area 141 has the form of a groove, and may be fixed to the metal plate 170 in the case where the recess area 141 has the form of a hole. In various embodiments, the height by which the water-cooled tube 160a is mounted on the shield can 140 may be the same as, or higher than, the height of the upper surface of the shield can 140.

According to various embodiments, the metal plate 170 may be formed of a different material from the shield can 140 and may have a higher thermal conductivity than the shield can 140. The metal plate 170 may primarily receive the heat generated by the electrical element 150 inside the shield can 140.

In various embodiments, the shield can 140 may be implemented with an aluminum material having a thickness of 0.4t, and the water-cooled tube 160a may be implemented with a copper material having a thickness of 0.5t. The metal plate 170 may be implemented with a copper alloy having a thickness of 0.15t.

According to various embodiments, the shield can 140, the water-cooled tube 160a, and the metal plate 170 may be manufactured through a press process. The shield can 140, the water-cooled tube 160a, and the metal plate 170 may be combined through solder paste work and solder reflow.

Figure 7:
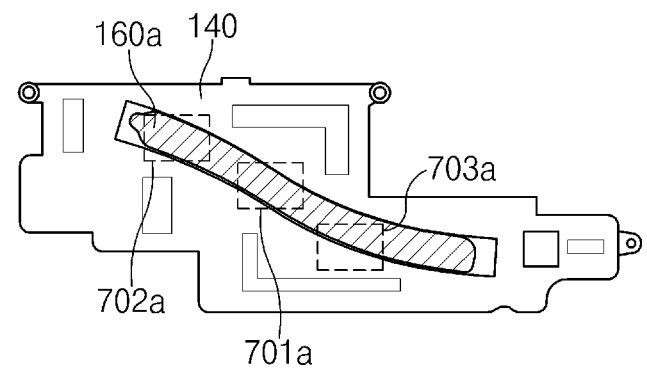
FIG. 7 illustrates a shield can covering a plurality of electrical elements according to various embodiments.
Figure 7:
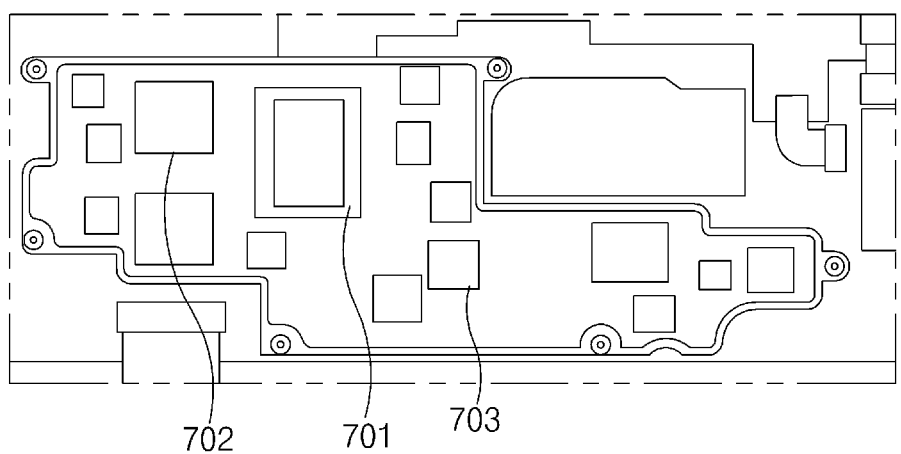

FIG. 7 illustrates a shield can covering a plurality of electrical elements according to various embodiments.

Referring to FIG. 7, the shield can 140 may include a plurality of electrical elements 701 to 703 therein. The plurality of electrical elements 701 to 703 may act as a heat source when the electronic device 101 is used. For example, the first electrical element 701 may be a CPU, the second electrical element 702 may be a GPU, and the third electrical element 703 may be a memory.

The shield can 140 may have, on the upper surface thereof, the water-cooled tube 160a passing through areas 701a to 703a that correspond to the positions of the plurality of electrical elements 701 to 703.

According to various embodiments, the water-cooled tube 160a may be arranged with respect to an area where an electrical element (e.g., a CPU) generating a relatively large amount of heat is disposed, and may extend to an area where another surrounding electrical element is disposed. For example, a central portion of the water-cooled tube 160a may be disposed in the first area 701a corresponding to the first electrical element 701, and a distal end or edge of the water-cooled tube 160a may extend to the second or third area 702a or 703a corresponding to the second or third electrical element 702 or 703.

Figure 8:
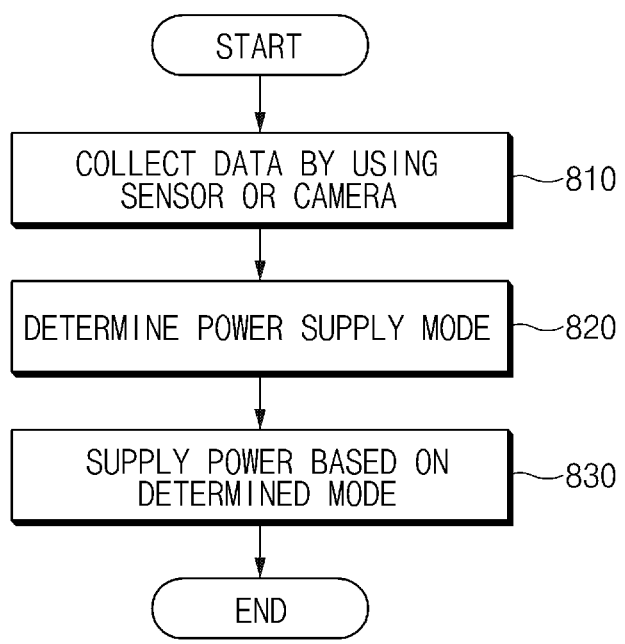
FIG. 8 is a flowchart illustrating a power control method based on various modes according to various embodiments.

FIG. 8 is a flowchart illustrating a power control method based on various modes according to various embodiments.

Referring to FIG. 8, a processor in the electronic device 101 may determine a power supply mode, based on a state in which the electronic device 101 is used or a state of a user that uses the electronic device 101, and may supply power according to settings of the determined mode.

In operation 810, the processor may collect data on the state of the electronic device 101 or the user by using a sensor or a camera. For example, the processor may recognize the tilt of the electronic device 101 by using an accelerometer sensor.

The amount of released heat may vary depending on a condition under which the user uses the electronic device 101 (e.g., the angle or direction of a system, accessory keyboard docking, or the like), and the maximum power to be supplied within a part reliability range may vary correspondingly. For example, the maximum power (thermal design power (TDP)) to be supplied in a range below the temperature that a CPU/GPU is capable of resisting may be stored in advance and may be referred to as needed.

In the case where the electronic device 101 is parallel to the direction of gravity, that is, the electronic device 101 is placed upright on the floor, a convective heat radiation effect may be improved, which results in an increase in the amount of released heat. Accordingly, the maximum power to be supplied to the CPU/GPU may be raised (e.g., 8 W). In contrast, in the case where the electronic device 101 is in a horizontal state, the convective heat radiation effect may be reduced, which leads to a decrease in the maximum power (e.g., 6 W) to be supplied to the CPU/GPU.

In operation 820, the processor may determine a power supply mode, based on the collected data. In various embodiments, the power supply mode may include a docking keyboard mode, a game mode, a vertical mode, an inclined mode, a horizontal mode, a handheld vertical mode, a book reading vertical mode, a camera mode, a handheld horizontal mode, an ON table mode, or the like.

In the docking keyboard mode, pogo pins may be used to connect and recognize a keyboard, and the electronic device 101 may not have a limitation in surface temperature since the user uses the keyboard with the hands placed on the keyboard in most cases when the keyboard is connected. In the docking keyboard mode, the processor may raise the maximum CPU/GPU power supply value to maximize performance.

The game mode may correspond to a state in which the user is analyzed to execute a game application or visit and use a game-related site. The processor may output a UI screen through which the user selects the game mode, and may raise the maximum CPU/GPU power supply value in response to the user's selection.

The vertical mode may correspond to a case where the processor determines that the electronic device 101 is maintained in a vertical state for a predetermined period of time, by analyzing the angle of the electronic device 101 using an accelerometer sensor. The processor may output a UI screen through which the user selects whether to adjust the maximum CPU/GPU power supply value to a vertical mode value, and may raise the maximum CPU/GPU power supply value in response to the user's selection.

The camera mode may be executed when a camera module operates. A relatively large amount of CPU/GPU power supply resources may be required and the maximum CPU/GPU power supply value may be raised when the camera module operates.

The inclined mode may correspond to a case where the processor determines that the electronic device 101 is maintained at a specified angle for a predetermined period of time, by analyzing the angle of the electronic device 101 using an accelerometer sensor. The processor may output a UI screen through which the user selects whether to adjust the maximum CPU/GPU power supply value to an inclined mode value, and may raise the maximum CPU/GPU power supply value in response to the user's selection.

The horizontal mode may correspond to a case where the processor determines that the electronic device 101 is maintained in a horizontal state for a predetermined period of time, by analyzing the angle of the electronic device 101 using an accelerometer sensor. The processor may output a UI screen through which the user selects whether to adjust the maximum CPU/GPU power supply value to a horizontal mode value, and may raise the maximum CPU/GPU power supply value in response to the user's selection.

The handheld vertical mode may correspond to a case where the processor determines that the electronic device 101 is maintained at a specified angle for a predetermined period of time, by determining the user's holding state using a grip sensor and analyzing the angle of the electronic device 101 using an accelerometer sensor. The processor may output a UI screen through which the user selects whether to adjust the maximum CPU/GPU power supply value to a corresponding mode value, and may raise the maximum CPU/GPU power supply value in response to the user's selection.

The vertical book reading mode may correspond to a case where the processor determines that the electronic device 101 is maintained in a vertical state for a predetermined period of time, by determining the user's holding state using a grip sensor of a system and analyzing the angle of the electronic device 101 using an accelerometer sensor. The processor may output a UI screen through which the user selects whether to adjust the maximum CPU/GPU power supply value to a corresponding mode value, and may raise the maximum CPU/GPU power supply value in response to the user's selection.

The handheld horizontal mode may correspond to a case where the processor determines that the electronic device 101 is maintained in a horizontal state for a predetermined period of time, by determining the user's holding state using a grip sensor of a system and analyzing the angle of the electronic device 101 using an accelerometer sensor. The processor may output a UI screen through which the user selects whether to adjust the maximum CPU/GPU power supply value to a corresponding mode value, and may raise the maximum CPU/GPU power supply value in response to the user's selection.

The ON table mode may correspond to a case where the processor analyzes the angle of the electronic device 101 by using an accelerometer sensor to determine whether the electronic device 101 is in a horizontal state and a rear camera is hidden by a table so that the brightness of light is maintained at a predetermine level or lower for a predetermined period of time. The processor may output a UI screen through which the user selects the maximum CPU/GPU power supply value to be an ON table mode value, and may raise the maximum CPU/GPU power supply value in response to the user's selection.

In various embodiments, the processor may set different maximum power values in consideration of heat release characteristics of each mode.

In operation 830, the processor may supply power, based on the determined mode.

Figure 9:
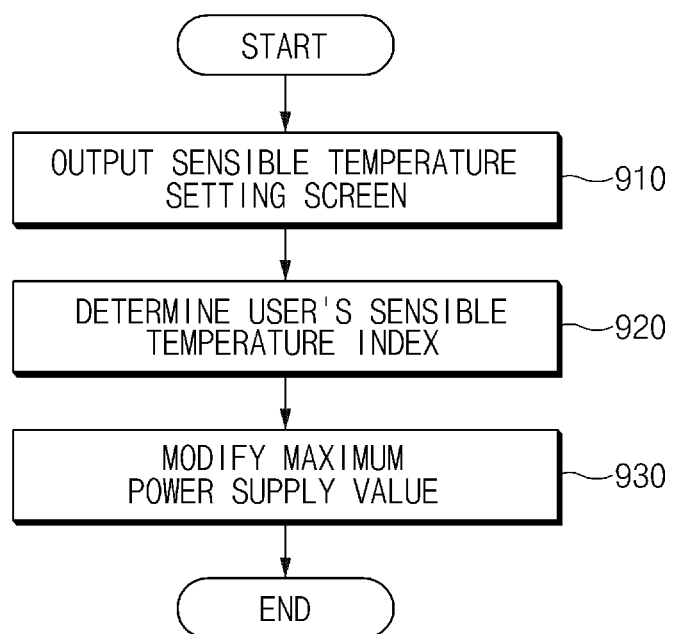
FIG. 9 is a flowchart illustrating a power control method based on a user's sensible temperature index according to various embodiments.

FIG. 9 is a flowchart illustrating a power control method based on a user's sensible temperature index according to various embodiments.

Referring to FIG. 9, in operation 910, the processor in the electronic device 101 may supply power, based on the user's sensible temperature index that the electronic device 101 uses.

Since users differently feel the same temperature, the processor may determine the user's sensible temperature index and may adjust the maximum power to be supplied, based on the determined index.

In operation 910, the processor may output a sensible temperature setting screen on the display thereof. The setting screen may output a surface temperature level allowed by the electronic device 101 and may include an option for selecting a degree desired by the user. In various embodiments, the setting screen may allow setting of sensible temperature through relative temperature display (e.g., very hot/hot/slightly hot) other than absolute temperature display.

In operation 920, the processor may determine a sensible temperature index, based on the user's selection.

In operation 930, the processor may modify the maximum CPU/GPU power supply value set in advance, based on the determined sensible temperature index.

Figure 10:
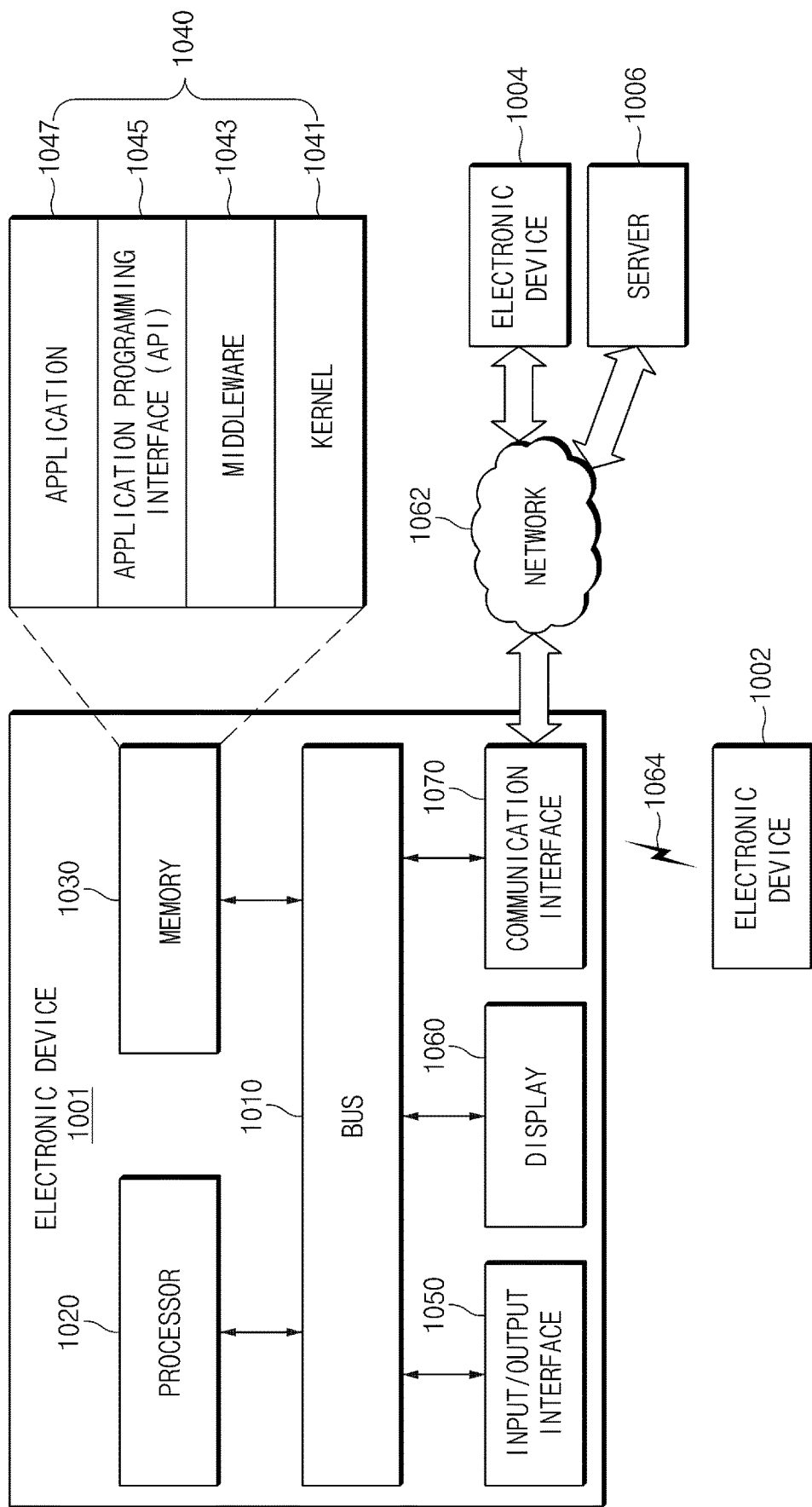
FIG. 10 illustrates an electronic device in a network environment according to an embodiment of the present disclosure.

FIG. 10 illustrates an electronic device in a network environment according to an embodiment of the present disclosure.

An electronic device 1001 in a network environment 1000 according to various embodiments of the present disclosure will be described with reference to FIG. 10. The electronic device 1001 may include a bus 1010, a processor 1020, a memory 1030, an input/output interface 1050, a display 1060, and a communication interface 1070. In various embodiments of the present disclosure, at least one of the foregoing elements may be omitted or another element may be added to the electronic device 1001.

The bus 1010 may include a circuit for connecting the above-mentioned elements 1010 to 1070 to each other and transferring communications (e.g., control messages and/or data) among the above-mentioned elements.

The processor 1020 may include at least one of a central processing unit (CPU), an application processor (AP), or a communication processor (CP). The processor 1020 may perform data processing or an operation related to communication and/or control of at least one of the other elements of the electronic device 1001.

The memory 1030 may include a volatile memory and/or a nonvolatile memory. The memory 1030 may store instructions or data related to at least one of the other elements of the electronic device 1001. According to an embodiment of the present disclosure, the memory 1030 may store software and/or a program 1040. The program 1040 may include, for example, a kernel 1041, a middleware 1043, an application programming interface (API) 1045, and/or an application program (or an application) 1047. At least a portion of the kernel 1041, the middleware 1043, or the API 1045 may be referred to as an operating system (OS).

The kernel 1041 may control or manage system resources (e.g., the bus 1010, the processor 1020, the memory 1030, or the like) used to perform operations or functions of other programs (e.g., the middleware 1043, the API 1045, or the application program 1047). Furthermore, the kernel 1041 may provide an interface for allowing the middleware 1043, the API 1045, or the application program 1047 to access individual elements of the electronic device 1001 in order to control or manage the system resources.

The middleware 1043 may serve as an intermediary so that the API 1045 or the application program 1047 communicates and exchanges data with the kernel 1041.

Furthermore, the middleware 1043 may handle one or more task requests received from the application program 1047 according to a priority order. For example, the middleware 1043 may assign at least one application program 1047 a priority for using the system resources (e.g., the bus 1010, the processor 1020, the memory 1030, or the like) of the electronic device 1001. For example, the middleware 1043 may handle the one or more task requests according to the priority assigned to the at least one application, thereby performing scheduling or load balancing with respect to the one or more task requests.

The API 1045, which is an interface for allowing the application 1047 to control a function provided by the kernel 1041 or the middleware 1043, may include, for example, at least one interface or function (e.g., instructions) for file control, window control, image processing, character control, or the like.

The input/output interface 1050 may serve to transfer an instruction or data input from a user or another external device to (an)other element(s) of the electronic device 1001. Furthermore, the input/output interface 1050 may output instructions or data received from (an)other element(s) of the electronic device 1001 to the user or another external device.

The display 1060 may include, for example, a liquid crystal display (LCD), a light-emitting diode (LED) display, an organic light-emitting diode (OLED) display, a microelectromechanical systems (MEMS) display, or an electronic paper display. The display 1060 may present various content (e.g., a text, an image, a video, an icon, a symbol, or the like) to the user. The display 1060 may include a touch screen, and may receive a touch, gesture, proximity or hovering input from an electronic pen or a part of a body of the user.

The communication interface 1070 may set communications between the electronic device 1001 and an external device (e.g., a first external electronic device 1002, a second external electronic device 1004, or a server 1006). For example, the communication interface 1070 may be connected to a network 1062 via wireless communications or wired communications so as to communicate with the external device (e.g., the second external electronic device 1004 or the server 1006).

The wireless communications may employ at least one of cellular communication protocols such as long-term evolution (LTE), LTE-advance (LTE-A), code division multiple access (CDMA), wideband CDMA (WCDMA), universal mobile telecommunications system (UMTS), wireless broadband (WiBro), or global system for mobile communications (GSM). The wireless communications may include, for example, a short-range communications 1064. The short-range communications may include at least one of wireless fidelity (Wi-Fi), Bluetooth, near field communication (NFC), magnetic stripe transmission (MST), or GNSS.

The MST may generate pulses according to transmission data and the pulses may generate electromagnetic signals. The electronic device 1001 may transmit the electromagnetic signals to a reader device such as a POS (point of sales) device. The POS device may detect the magnetic signals by using a MST reader and restore data by converting the detected electromagnetic signals into electrical signals.

The GNSS may include, for example, at least one of global positioning system (GPS), global navigation satellite system (GLONASS), BeiDou navigation satellite system (BeiDou), or Galileo, the European global satellite-based navigation system according to a use area or a bandwidth. Hereinafter, the term "GPS" and the term "GNSS" may be interchangeably used. The wired communications may include at least one of universal serial bus (USB), high definition multimedia interface (HDMI), recommended standard 832 (RS-232), plain old telephone service (POTS), or the like. The network 1062 may include at least one of telecommunications networks, for example, a computer network (e.g., local area network (LAN) or wide area network (WAN)), the Internet, or a telephone network.

The types of the first external electronic device 1002 and the second external electronic device 1004 may be the same as or different from the type of the electronic device 1001. According to an embodiment of the present disclosure, the server 1006 may include a group of one or more servers. A portion or all of operations performed in the electronic device 1001 may be performed in one or more other electronic devices (e.g., the first electronic device 1002, the second external electronic device 1004, or the server 1006). When the electronic device 1001 should perform a certain function or service automatically or in response to a request, the electronic device 1001 may request at least a portion of functions related to the function or service from another device (e.g., the first electronic device 1002, the second external electronic device 1004, or the server 1006) instead of or in addition to performing the function or service for itself. The other electronic device (e.g., the first electronic device 1002, the second external electronic device 1004, or the server 1006) may perform the requested function or additional function, and may transfer a result of the performance to the electronic device 1001. The electronic device 1001 may use a received result itself or additionally process the received result to provide the requested function or service. To this end, for example, a cloud computing technology, a distributed computing technology, or a client-server computing technology may be used.

Figure 11:
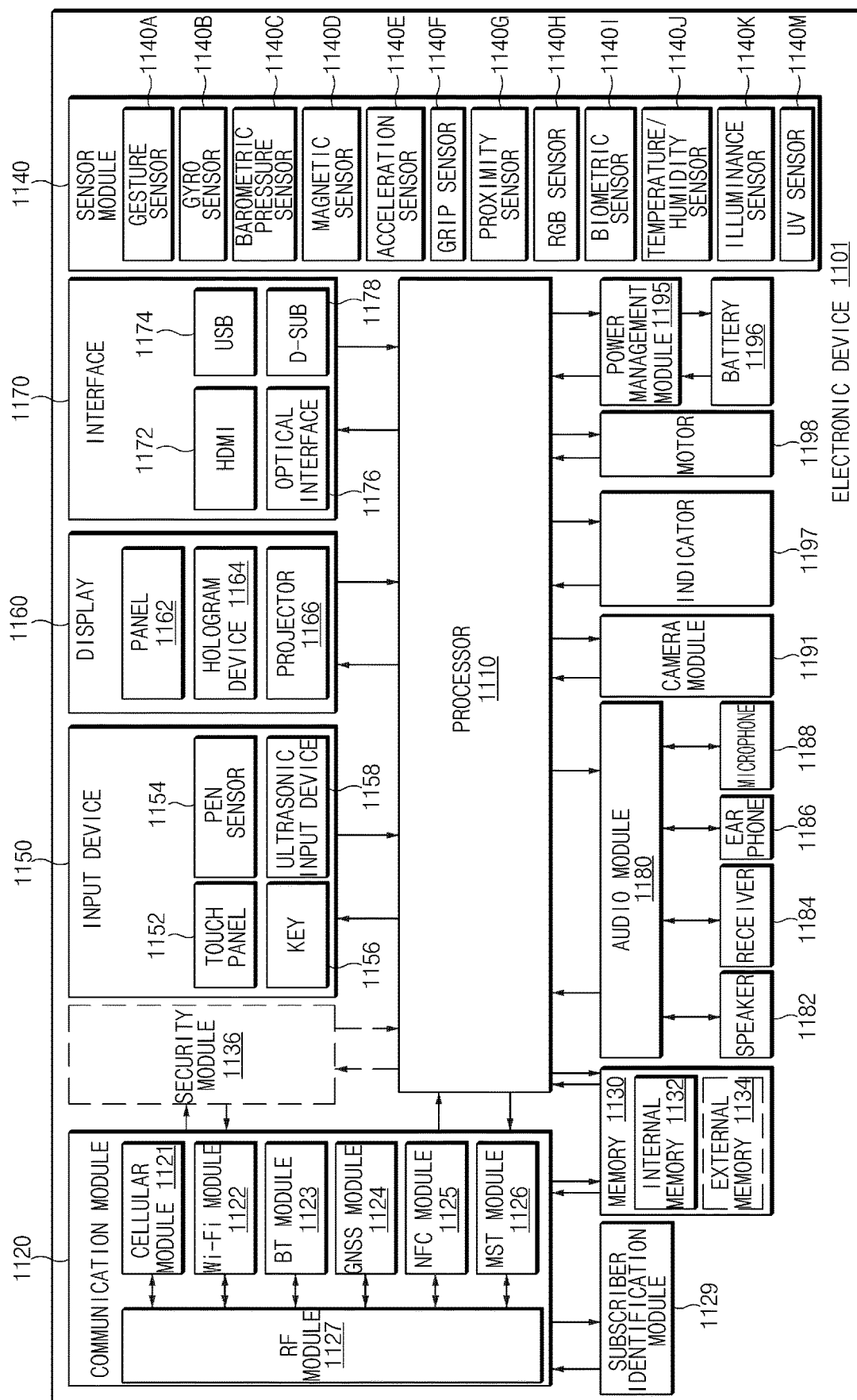
FIG. 11 is a block diagram illustrating an electronic device according to an embodiment of the present disclosure.

FIG. 11 is a block diagram illustrating a configuration of an electronic device according to an embodiment of the present disclosure.

Referring to FIG. 11, the electronic device 1101 may include, for example, all or part of an electronic device 1001 shown in FIG. 10. The electronic device 1101 may include one or more processors 1110 (e.g., application processors (APs)), a communication module 1120, a subscriber identification module (SIM) 1129, a memory 1130, a security module 1136, a sensor module 1140, an input device 1150, a display 1160, an interface 1170, an audio module 1180, a camera module 1191, a power management module 1195, a battery 1196, an indicator 1197, and a motor 1198.

The processor 1110 may drive, for example, an operating system (OS) or an application program to control a plurality of hardware or software components connected thereto and may process and compute a variety of data. The processor 1110 may be implemented with, for example, a system on chip (SoC). According to an embodiment of the present disclosure, the processor 1110 may include a graphic processing unit (GPU) (not shown) and/or an image signal processor (not shown). The processor 1110 may include at least some (e.g., a cellular module 1121) of the components shown in FIG. 11. The processor 1110 may load a command or data received from at least one of other components (e.g., a non-volatile memory) into a volatile memory to process the data and may store various data in a non-volatile memory.

The communication module 1120 may have the same or similar configuration to the communication interface 1070 of FIG. 10. The communication module 1120 may include, for example, the cellular module 1121, a wireless-fidelity (Wi-Fi) module 1122, a Bluetooth (BT) module 1123, a global navigation satellite system (GNSS) module 1124 (e.g., a GPS module, a Glonass module, a Beidou module, or a Galileo module), a near field communication (NFC) module 1125, an MST module 1126, and a radio frequency (RF) module 1127.

The cellular module 1121 may provide, for example, a voice call service, a video call service, a text message service, or an Internet service, and the like through a communication network. According to an embodiment of the present disclosure, the cellular module 1121 may identify and authenticate the electronic device 1101 in a communication network using the SIM 1129 (e.g., a SIM card). According to an embodiment of the present disclosure, the cellular module 1121 may perform at least part of functions which may be provided by the processor 1110. According to an embodiment of the present disclosure, the cellular module 1121 may include a communication processor (CP).

The Wi-Fi module 1122, the BT module 1123, the GNSS module 1124, the NFC module 1125, or the MST module 1126 may include, for example, a processor for processing data transmitted and received through the corresponding module. According to various embodiments of the present disclosure, at least some (e.g., two or more) of the cellular module 1121, the Wi-Fi module 1122, the BT module 1123, the GNSS module 1124, the NFC module 1125, or the MST module 1126 may be included in one integrated chip (IC) or one IC package.

The RF module 1127 may transmit and receive, for example, a communication signal (e.g., an RF signal). Though not shown, the RF module 1127 may include, for example, a transceiver, a power amplifier module (PAM), a frequency filter, or a low noise amplifier (LNA), or an antenna, and the like. According to another embodiment of the present disclosure, at least one of the cellular module 1121, the Wi-Fi module 1122, the BT module 1123, the GNSS module 1124, the NFC module 1125, or the MST module 1126 may transmit and receive an RF signal through a separate RF module.

The SIM 1129 may include, for example, a card which includes a SIM and/or an embedded SIM. The SIM 1129 may include unique identification information (e.g., an integrated circuit card identifier (ICCID)) or subscriber information (e.g., an international mobile subscriber identity (IMSI)).

The memory 1130 (e.g., a memory 1030 of FIG. 10) may include, for example, an embedded memory 1132 or an external memory 1134. The embedded memory 1132 may include at least one of, for example, a volatile memory (e.g., a dynamic random access memory (DRAM), a static RAM (SRAM), a synchronous dynamic RAM (SDRAM), and the like), or a non-volatile memory (e.g., a one-time programmable read only memory (OTPROM), a programmable ROM (PROM), an erasable and programmable ROM (EPROM), an electrically erasable and programmable ROM (EEPROM), a mask ROM, a flash ROM, a flash memory (e.g., a NAND flash memory or a NOR flash memory, and the like), a hard drive, or a solid state drive (SSD)).

The external memory 1134 may include a flash drive, for example, a compact flash (CF), a secure digital (SD), a micro-SD, a mini-SD, an extreme digital (xD), a multimedia car (MMC), or a memory stick, and the like. The external memory 1134 may operatively and/or physically connect with the electronic device 1101 through various interfaces.

The security module 1136 may be a module which has a relatively higher secure level than the memory 1130 and may be a circuit which stores secure data and guarantees a protected execution environment. The security module 1136 may be implemented with a separate circuit and may include a separate processor. The security module 1136 may include, for example, an embedded secure element (eSE) which is present in a removable smart chip or a removable SD card or is embedded in a fixed chip of the electronic device 1101. Also, the security module 1136 may be driven by an OS different from the OS of the electronic device 1101. For example, the security module 1136 may operate based on a java card open platform (JCOP) OS.

The sensor module 1140 may measure, for example, a physical quantity or may detect an operation state of the electronic device 1101, and may convert the measured or detected information to an electric signal. The sensor module 1140 may include at least one of, for example, a gesture sensor 1140A, a gyro sensor 1140B, a barometric pressure sensor 1140C, a magnetic sensor 1140D, an acceleration sensor 1140E, a grip sensor 1140F, a proximity sensor 1140G, a color sensor 1140H (e.g., red, green, blue (RGB) sensor), a biometric sensor 1140I, a temperature/humidity sensor 1140J, an illumination sensor 1140K, or an ultraviolet (UV) sensor 1140M. Additionally or alternatively, the sensor module 1140 may further include, for example, an e-nose sensor (not shown), an electromyography (EMG) sensor (not shown), an electroencephalogram (EEG) sensor (not shown), an electrocardiogram (ECG) sensor (not shown), an infrared (IR) sensor (not shown), an iris sensor (not shown), and/or a fingerprint sensor (not shown), and the like. The sensor module 1140 may further include a control circuit for controlling at least one or more sensors included therein. According to various embodiments of the present disclosure, the electronic device 1101 may further include a processor configured to control the sensor module 1140, as part of the processor 1110 or to be independent of the processor 1110. While the processor 1110 is in a sleep state, the electronic device 1101 may control the sensor module 1140.

The input device 1150 may include, for example, a touch panel 1152, a (digital) pen sensor 1154, a key 1156, or an ultrasonic input device 1158. The touch panel 1152 may use at least one of, for example, a capacitive type, a resistive type, an infrared type, or an ultrasonic type. Also, the touch panel 1152 may further include a control circuit. The touch panel 1152 may further include a tactile layer and may provide a tactile reaction to a user.

The (digital) pen sensor 1154 may be, for example, part of the touch panel 1152 or may include a separate sheet for recognition. The key 1156 may include, for example, a physical button, an optical key, or a keypad. The ultrasonic input device 1158 may allow the electronic device 1101 to detect a sound wave using a microphone (e.g., a microphone 1188) and to verify data through an input tool generating an ultrasonic signal.

The display 1160 (e.g., a display 1060 of FIG. 10) may include a panel 1162, a hologram device 1164, or a projector 1166. The panel 1162 may include the same or similar configuration to the display 1060. The panel 1162 may be implemented to be, for example, flexible, transparent, or wearable. The panel 1162 and the touch panel 1152 may be integrated into one module. The hologram device 1164 may show a stereoscopic image in a space using interference of light. The projector 1166 may project light onto a screen to display an image. The screen may be positioned, for example, inside or outside the electronic device 1101. According to an embodiment of the present disclosure, the display 1160 may further include a control circuit for controlling the panel 1162, the hologram device 1164, or the projector 1166.

The interface 1170 may include, for example, a high-definition multimedia interface (HDMI) 1172, a universal serial bus (USB) 1174, an optical interface 1176, or a D-subminiature 1178. The interface 1170 may be included in, for example, the communication interface 1070 shown in FIG. 10. Additionally or alternatively, the interface 1170 may include, for example, a mobile high definition link (MHL) interface, an SD card/multimedia card (MMC) interface, or an infrared data association (IrDA) standard interface.

The audio module 1180 may convert a sound and an electric signal in dual directions. At least part of components of the audio module 1180 may be included in, for example, an input and output interface 1050 (or a user interface) shown in FIG. 10. The audio module 1180 may process sound information input or output through, for example, a speaker 1182, a receiver 1184, an earphone 1186, or the microphone 1188, and the like.

The camera module 1191 may be a device which captures a still image and a moving image. According to an embodiment of the present disclosure, the camera module 1191 may include one or more image sensors (not shown) (e.g., a front sensor or a rear sensor), a lens (not shown), an image signal processor (ISP) (not shown), or a flash (not shown) (e.g., an LED or a xenon lamp).

The power management module 1195 may manage, for example, power of the electronic device 1101. According to an embodiment of the present disclosure, though not shown, the power management module 1195 may include a power management integrated circuit (PMIC), a charger IC or a battery or fuel gauge. The PMIC may have a wired charging method and/or a wireless charging method. The wireless charging method may include, for example, a magnetic resonance method, a magnetic induction method, or an electromagnetic method, and the like. An additional circuit for wireless charging, for example, a coil loop, a resonance circuit, or a rectifier, and the like may be further provided. The battery gauge may measure, for example, the remaining capacity of the battery 1196 and voltage, current, or temperature thereof while the battery 1196 is charged. The battery 1196 may include, for example, a rechargeable battery or a solar battery.

The indicator 1197 may display a specific state of the electronic device 1101 or part (e.g., the processor 1110) thereof, for example, a booting state, a message state, or a charging state, and the like. The motor 1198 may convert an electric signal into mechanical vibration and may generate vibration or a haptic effect, and the like. Though not shown, the electronic device 1101 may include a processing unit (e.g., a GPU) for supporting a mobile TV. The processing unit for supporting the mobile TV may process media data according to standards, for example, a digital multimedia broadcasting (DMB) standard, a digital video broadcasting (DVB) standard, or a MediaFLO™ standard, and the like.

Each of the above-mentioned elements of the electronic device according to various embodiments of the present disclosure may be configured with one or more components, and names of the corresponding elements may be changed according to the type of the electronic device. The electronic device according to various embodiments of the present disclosure may include at least one of the above-mentioned elements, some elements may be omitted from the electronic device, or other additional elements may be further included in the electronic device. Also, some of the elements of the electronic device according to various embodiments of the present disclosure may be combined with each other to form one entity, thereby making it possible to perform the functions of the corresponding elements in the same manner as before the combination.

According to various embodiments, an electronic device includes a housing, a printed circuit board located inside the housing, an electrical element mounted on the printed circuit board, and a shield can configured to cover the electrical element, wherein a recess area is formed on at least a portion of the shield can and a metal structure is mounted in the recess area to cool heat generated by the electrical element.

According to various embodiments, the metal structure is formed of a material that has a higher thermal conductivity than a material of which the shield can is formed.

According to various embodiments, the metal structure contains fluid or a phase change material and cools the heat generated by the electrical element, by using heat of vaporization of the fluid or the phase change material.

According to various embodiments, the metal structure has the form of a tube or a chamber.

According to various embodiments, the shield can includes a metal plate disposed between the electrical element and the recess area, and the metal plate has a larger area than a surface in contact with the electrical element.

According to various embodiments, the metal plate is formed of a material that has a higher thermal conductivity than a material of which the shield can is formed.

According to various embodiments, the metal plate is formed of an alloy that contains a material of which the metal structure is formed.

According to various embodiments, the metal plate is directly attached to the metal structure.

According to various embodiments, the metal plate has a smaller thickness than the shield can.

According to various embodiments, the metal plate is formed in a form in which a plurality of plates are stacked, and among the plurality of plates, a first plate is disposed between the metal structure and the electrical element and a second plate is disposed to surround the first plate and connected to the shield can.

According to various embodiments, a cover heat sheet is attached to at least a portion of the housing that is adjacent to the shield can.

According to various embodiments, the electronic device further includes at least one support disposed between the housing and the shield can, wherein the support forms an air layer between the housing and the shield can.

According to various embodiments, the recess area has the form of a hole passing through the shield can or the form of a groove formed in a direction toward the electrical element.

According to various embodiments, the recess area corresponds to a relatively thin area of a first surface of the shield can.

According to various embodiments, a plurality of electrical elements mounted on the printed circuit board are included in the shield can, wherein a first portion of the metal structure is disposed adjacent to a first element of the plurality of electrical elements, and wherein a second portion of the metal structure is disposed adjacent to a second element of the plurality of electrical elements.

The term "module" used herein may represent, for example, a unit including one of hardware, software and firmware or a combination thereof. The term "module" may be interchangeably used with the terms "unit", "logic", "logical block", "component" and "circuit". The "module" may be a minimum unit of an integrated component or may be a part thereof. The "module" may be a minimum unit for performing one or more functions or a part thereof. The "module" may be implemented mechanically or electronically. For example, the "module" may include at least one of an application-specific integrated circuit (ASIC) chip, a field-programmable gate array (FPGA), and a programmable-logic device for performing some operations, which are known or will be developed.

At least a part of devices (e.g., modules or functions thereof) or methods (e.g., operations) according to various embodiments of the present disclosure may be implemented as instructions stored in a computer-readable storage medium in the form of a program module. In the case where the instructions are performed by a processor (e.g., the processor 1020), the processor may perform functions corresponding to the instructions. The computer-readable storage medium may be, for example, the memory 1030.

A computer-readable recording medium may include a hard disk, a floppy disk, a magnetic medium (e.g., a magnetic tape), an optical medium (e.g., CD-ROM, digital versatile disc (DVD)), a magneto-optical medium (e.g., a floptical disk), or a hardware device (e.g., a ROM, a RAM, a flash memory, or the like). The program instructions may include machine language codes generated by compilers and high-level language codes that can be executed by computers using interpreters. The above-mentioned hardware device may be configured to be operated as one or more software modules for performing operations of various embodiments of the present disclosure and vice versa.

A module or a program module according to various embodiments of the present disclosure may include at least one of the above-mentioned elements, or some elements may be omitted or other additional elements may be added. Operations performed by the module, the program module or other elements according to various embodiments of the present disclosure may be performed in a sequential, parallel, iterative or heuristic way. Furthermore, some operations may be performed in another order or may be omitted, or other operations may be added.

While the present disclosure has been shown and described with reference to certain embodiments thereof, it will be understood by those skilled in the art that various changes in form and details may be made therein without departing from the scope of the present disclosure. Therefore, the scope of the present disclosure should not be defined as being limited to the embodiments, but should be defined by the appended claims and equivalents thereof.

What is claimed is:

1. An electronic device comprising:
a housing;
a printed circuit board located inside the housing;
an electrical element mounted on the printed circuit board;
a shield can configured to cover the electrical element;
a water-cooled tube disposed on an upper surface of the electrical element for dissipating heat generated by the electrical element; and
a thermal interface material disposed between the water-cooled tube and the electrical element.

2. The electronic device of claim 1, wherein a thermal conductivity of a material of the water-cooled tube is greater than a thermal conductivity of a material of the shield can.

3. The electronic device of claim 1, wherein the water-cooled tube contains fluid or a phase change material for cooling the heat generated by the electrical element.

4. The electronic device of claim 3, wherein the water-cooled tube comprises a tube or a chamber.

5. The electronic device of claim 1, wherein the shield can includes a metal plate disposed between the electrical element and the water-cooled tube, and
wherein the metal plate has a larger area than a surface thereof which is in contact with the electrical element.

6. The electronic device of claim 5, wherein a thermal conductivity of a material of the metal plate is greater than a thermal conductivity of a material of the shield can.

7. The electronic device of claim 5, wherein the metal plate comprises an alloy including a material comprising the water-cooled tube.

8. The electronic device of claim 5, wherein the metal plate is directly attached to the water-cooled tube.

9. The electronic device of claim 5, wherein the metal plate has a smaller thickness than the shield can.

10. The electronic device of claim 5, wherein the metal plate comprises a plurality of stacked plates, and
wherein the plurality of stacked plates include a first plate disposed between the water-cooled tube and the electrical element and a second plate disposed to surround the first plate and connected to the shield can.

11. The electronic device of claim 1, further comprising a cover heat sheet attached to at least a portion of the housing adjacent to the shield can.

12. The electronic device of claim 1, further comprising:
at least one support disposed between the housing and the shield can, wherein the support is configured to provide an air layer between the housing and the shield can.

13. The electronic device of claim 1, wherein a recess area is formed on at least a portion of the shield can and comprises one of a hole passing through the shield can or a groove formed in a direction toward the electrical element, and
wherein the water-cooled tube is mounted in the recess area.

14. The electronic device of claim 13, wherein the recess area corresponds to a thinned area of a first surface of the shield can.

15. The electronic device of claim 1, wherein a plurality of electrical elements mounted on the printed circuit board are included in the shield can,
   wherein a first portion of the water-cooled tube is disposed adjacent to a first element of the plurality of electrical elements, and
   wherein a second portion of the water-cooled tube is disposed adjacent to a second element of the plurality of electrical elements.

* * * * *